United States Patent [19]

Katsumata

[11] Patent Number: 5,096,440
[45] Date of Patent: Mar. 17, 1992

[54] SURFACE MOUNT CONNECTOR WITH CIRCUIT BOARD RETAINING PLATE

[75] Inventor: Akira Katsumata, Tama, Japan

[73] Assignee: Kel Corporation, Tokyo, Japan

[21] Appl. No.: 698,682

[22] Filed: May 10, 1991

[51] Int. Cl.$^5$ .............................................. H01R 9/09
[52] U.S. Cl. ..................................... 439/570; 439/566
[58] Field of Search ..................... 439/65, 79, 80, 83, 439/562–563, 101, 108, 607

[56] References Cited

U.S. PATENT DOCUMENTS

| | | | |
|---|---|---|---|
| 4,628,410 | 12/1986 | Goodman et al. | 439/83 |
| 4,629,278 | 12/1986 | Norton et al. | 439/570 |
| 4,826,442 | 5/1989 | Douty et al. | 439/566 |
| 4,911,659 | 3/1990 | Viselli | 439/570 |
| 4,969,829 | 11/1990 | Sato | 439/571 |
| 5,007,844 | 4/1991 | Mason et al. | 439/83 |

Primary Examiner—Neil Abrams
Attorney, Agent, or Firm—Robert W. J. Usher

[57] ABSTRACT

Respective opposite ends of an insulating housing body of a surface mount connector are integrally formed with pairs of opposed, resilient, L-shaped arms, aligned with respective recesses extending under a board engaging face and embracing respective anchoring portions of respective retaining plates with a solder tab of each retaining plate received in a respective recess. Free ends of the arms extend towards each other in spaced apart relation defining between them an inspection window through which a reflow solder join between the solder tab and a dummy pad on the circuit board can be seen and checked from above the board.

5 Claims, 2 Drawing Sheets

SURFACE MOUNT CONNECTOR WITH CIRCUIT BOARD RETAINING PLATE

FIELD OF THE INVENTION

The invention relates to surface mount connectors.

BACKGROUND OF THE INVENTION

In surface mount techniques, individual terminals of a surface mount connector are connected to reflow solder pads of conductive tracks on the surface of a circuit board. Increasing miniaturization and complexity of integrated circuit devices necessitates that the terminals are both relatively thin and closely spaced, the resulting fragility requiring that the connector housing also be secured to the circuit board to afford strain relief, while the connectors themselves must also be closely packed together, occupying a minimum of circuit board area.

It is common practice to secure such connectors to a circuit board by using a metal retaining plate having a first portion anchored in the connector housing and a second, soldering portion attached to a dummy pad on the circuit board by reflow soldering.

In one known surface mount connector disclosed in Japanese Patent Application 63-167469, the soldering portion of the retaining plate protrudes horizontally beyond a longitudinal end of a circuit board engaging face of the housing. However, such construction requires additional circuit board area, which is undesirable.

In a second prior proposal, disclosed in Japanese utility model 63-169985, the retaining plate has a soldering portion located entirely underneath the housing which, although obviating a requirement for extra circuit board area, suffers from the disadvantage that the soldered connection is concealed from view above the board, obviating easy inspection of the solder joint, as required for good quality control.

SUMMARY OF THE INVENTION

It is an object of the invention to provide a surface mount connector having means for securing the connector housing to a pad on a circuit board which not only does not require additional board but which also forms a soldered join exposed for visual inspection from above the board.

According to the invention, a surface mount connector comprises an insulating housing body having an upper face and a lower, circuit board engaging face, a series of contacts mounted in the housing body with contact legs extending therefrom to the plane of the board engaging face for connection to respective individual tracks of a circuit board by a reflow solder technique, the housing body being formed with a retaining recess having first and second transverse sections extending along the board engaging face and, upwardly, adjacent a side face of the housing body, respectively, the first section being open at the board engaging face, a metal retaining plate having an anchoring portion and a solder tab extending transversely therefrom, the retaining plate being assembled with the housing body through the board engaging face with the anchoring portion received end first in the second section of the housing recess as an interference fit and the solder tab received in the first section of the recess to extend under the housing body with a face of the solder tab exposed for soldered connection to a dummy circuit board pad, the second section of the retaining recess opening to the side face of the housing body at least at a location adjacent the board engaging face forming an inspection window, through which a reflow solder connection of the face of the solder tab to a soldering pad on the circuit board can be visually inspected from above the circuit board.

The soldered connection can be readily inspected after reflow soldering to the circuit board enabling a continuously moving production line to be utilized for high volume, mass production, while maintaining high standards of quality control.

Preferably, the anchoring recess opens to the upper face and the inspection opening extends upwardly for substantially the entire height of the side face.

This both enables the entire position of the retaining plate to be checked and enables the walls defining the inspection opening to be resiliently flexible to admit and grip the anchoring portion of the retaining plate.

According to another aspect of the invention, a surface mount connector comprises an insulating housing body having an upper face and a lower, circuit board engaging face, a series of contacts mounted in the housing body with contact legs extending therefrom to the plane of the board engaging face for connection to respective tracks of a circuit board by a reflow solder technique, respective opposite ends of the housing body each being integrally formed with a pair of opposed, resilient, L-shaped arms, the arms of respective pairs having root end portions extending in spaced apart, side-by-side relation from the body and respective, transverse, free end portions extending towards each other with ends thereof spaced apart defining an inspection window therebetween, metal retaining plates each having an anchoring portion and a solder tab extending transversely therefrom, the retaining plates each being assembled with the housing body through the board engaging face with their respective anchoring portions received end first between respective arms of respective pairs and embraced thereby, and with the solder tab received in the recess to extend under the housing body with a face of the solder tab exposed for soldered connection to a dummy circuit board pad, so that a reflow solder connection of the face of the solder tab to a soldering pad on the circuit board can be visually inspected through the window from above the circuit board.

BRIEF INTRODUCTION TO THE DRAWINGS

A specific embodiment of the invention will now be described by way of example only with reference to the accompanying drawings in which:

FIG. 1 is a fragmentary perspective view of a surface mount connector according to the invention;

FIG. 2(a) and (b) are end elevational and side elevational views of the connector of FIG. 1;

Figure 4:
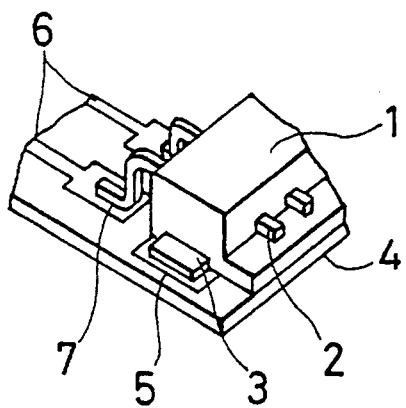
FIG. 4 is a fragmentary perspective view of a first example of a known surface mount connector; and, FIG. 5 is a second example of a known surface mount connector.

In the prior surface mount connector 1 shown in FIG. 4, a series of contacts 2 have respective legs 7 extending from a longitudinal side face thereof into connection with respective conductive tracks 6 on the surface of a circuit board 4 by a reflow soldering technique while a metal retaining plate 3 protrudes from an end face across the board and is secured to a dummy solder pad 5, thus occupying additional board area.

Figure 5:
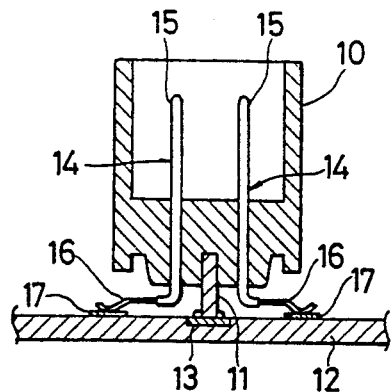

In the second example of prior surface mount connector shown in FIG. 5, rows of terminals 14 are mounted in an insulating housing 10 with mating pin portions 15 extending vertically into a housing cavity and resilient, board connecting portions 16 engaging respective tracks 17 on a circuit board. A metal retaining plate 11 depends from the center of the bottom board engaging face and has one longitudinal edge anchored in the housing and the opposite longitudinal edge soldered to a dummy pad 13 inlaid in the circuit board.

However, not only is the solder joint obscured from above but the inlay process is relatively expensive.

Figure 1:
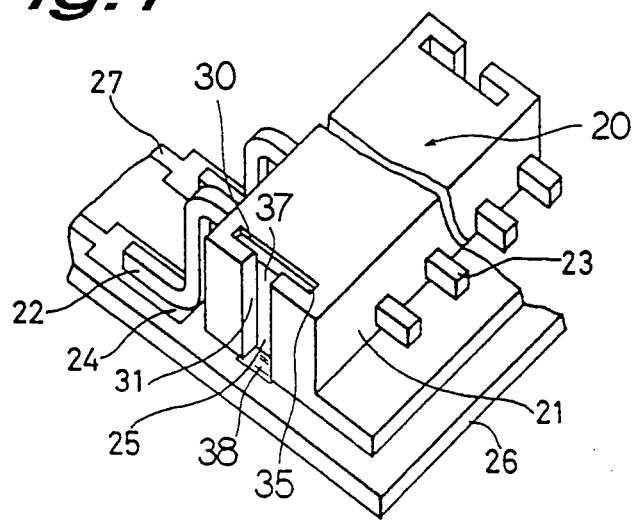
Figure 2A:
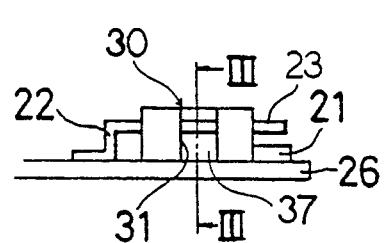
Figure 2B:
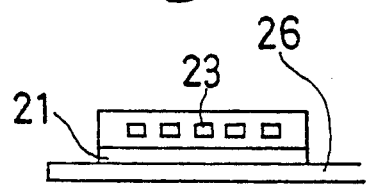
Figure 3:
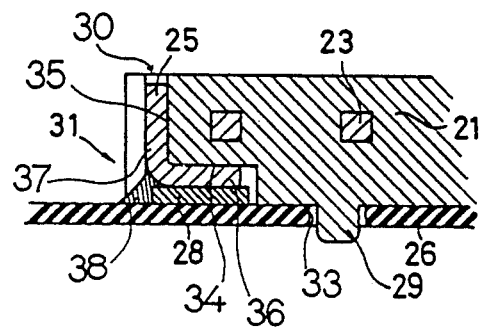
FIG. 3 is a fragmentary cross-sectional view taken along the line II—II of FIG. 2(a)

In the preferred example of the invention shown in FIGS. 1-3, the connector 20 has a rectanguloid insulating housing 21 and a row of contacts mounted therein extending from opposite longitudinal side faces, with respective contact legs 22 connected to surfaces of enlarged areas of tracks 27 of circuit board 26 by a reflow soldering technique.

An anchoring recess 30 is formed in respective longitudinal ends having a first, solder tab receiving section 34 extending under the lower circuit board engaging face and communicating with an upwardly extending anchoring section 35. The anchoring section 35 is of T-section, the stem section opening externally of the housing for the entire height of the end face thereof, both providing an inspection window 31 and defining resiliently flexible arm portions 32 on respective sides thereof.

A metal retaining plate 25 having a soldering tab 36 and an anchoring portion 37 extending transversely therefrom is received via the circuit board engaging face in the anchoring recess 30 with the anchoring tab 37 received end first as a force fit in the second anchoring section 35 (retention being aided by tangs on side edges, if required), and the tab seated in the section 34 of the recess which opens to the lower face and joined to a dummy pad 28 by reflow solder.

A locating peg 29 is integrally formed with the housing body and protrudes downwardly from the bottom thereof into an aperture 33 in the circuit board 26 to position the connector accurately thereon prior to soldering.

As will be appreciated from FIGS. 1 and 3, the reflow solder 38 forming the join between the solder tab 36 and the dummy pad 28 is visible through the inspection window 31 from above the connector when mounted on the board enabling easy inspection while not requiring additional circuit board area.

I claim:

1. A surface mount connector comprising an insulating housing body having an upper face and a lower, circuit board engaging face, a series of contacts mounted in the housing body with contact legs extending therefrom to the plane of the board engaging face for connection to respective individual tracks of a circuit board by a reflow solder technique, the housing body being formed with a retaining recess having first and second transverse sections extending along the board engaging face and, upwardly, adjacent a side face of the housing body, respectively, the first section being open at the board engaging face, a metal retaining plate having an anchoring portion and a solder tab extending transversely therefrom, the retaining plate being assembled with the housing body through the board engaging face with the anchoring portion received end first in the second section of the housing recess as an interference fit and the solder tab received in the first section of the recess to extend under the housing body with a face of the solder tab exposed for soldered connection to a dummy circuit board pad, the second section of the retaining recess opening to the side face of the housing body at least at a location adjacent the board engaging face forming an inspection window, through which a reflow solder connection of the face of the solder tab to a soldering pad on the circuit board can be visually inspected from above the circuit board.

2. A surface mount connector according to claim 1 in which the retaining recess opens to the upper face and the inspection opening extends upwardly for substantially the entire height of the side face.

3. A surface mount connector according to claim 2 in which wall portions defining the inspection window are resiliently flexible and grip the anchoring portion of the retaining plate.

4. A surface mount connector according to claim 3 in which the housing body is elongate and the contact legs extend in closely spaced relation from a longitudinal face thereof and the anchoring recess portion is formed in both longitudinal end faces of the housing body.

5. A surface mount connector comprising an insulating housing body having an upper face and a lower, circuit board engaging face, a series of contacts mounted in the housing body with contact legs extending therefrom to the plane of the board engaging face for connection to respective individual tracks of a circuit board by a reflow solder technique, respective opposite ends of the housing body each being integrally formed with a pair of opposed, resilient, L-shaped arms, the arms of respective pairs having root end portions extending in spaced apart, side-by-side relation from the body and respective, transverse, free end portions extending towards each other with ends thereof spaced apart defining an inspection window therebetween, metal retaining plates each having an anchoring portion and a solder tab extending transversely therefrom, the retaining plates each being assembled with the housing body through the board engaging face with their respective anchoring portions received end first between respective arms of respective pairs and embraced thereby, and with the solder tab received in the recess to extend under the housing body with a face of the solder tab exposed for soldered connection to a dummy circuit board pad, so that a reflow solder connection of the face of the solder tab to a soldering pad on the circuit board can be visually inspected through the window from above the circuit board.

* * * * *